United States Patent [19]

Nakayama

[11] Patent Number: 5,119,269
[45] Date of Patent: Jun. 2, 1992

[54] SEMICONDUCTOR WITH A BATTERY UNIT

[75] Inventor: Iwao Nakayama, Nagano, Japan

[73] Assignee: Seiko Epson Corporation, Tokyo, Japan

[21] Appl. No.: 571,195

[22] Filed: Aug. 23, 1990

[30] Foreign Application Priority Data

Aug. 23, 1989 [JP] Japan .................................. 1-217067
Aug. 23, 1989 [JP] Japan .................................. 1-217068

[51] Int. Cl.⁵ ........................ H02B 1/00; H01L 23/16
[52] U.S. Cl. .................................... 361/380; 361/392;
361/405; 365/229; 357/75
[58] Field of Search ............... 361/380, 392, 393, 396,
361/394, 405; 365/228, 229, 62, 52; 357/76, 75;
307/150; 429/99

[56] References Cited

U.S. PATENT DOCUMENTS

| 4,645,943 | 2/1987 | Smith, Jr. et al. | |
|---|---|---|---|
| 4,992,987 | 2/1991 | Echols et al. | 365/229 |
| 4,998,888 | 3/1991 | Link et al. | 439/73 |

Primary Examiner—Leo P. Picard
Assistant Examiner—Young S. Whang
Attorney, Agent, or Firm—Spensley Horn Jubas & Lubitz

[57] ABSTRACT

A semiconductor circuit assembly composed of: a semiconductor device including at least one semiconductor element, battery lead terminals which are connected to the element, and a molded resin body encapsulating the element and the lead terminals and having at least one main exterior surface; and a battery unit mounted on the exterior surface of the semiconductor device, the battery unit having battery leads connected to the lead terminals and a battery holder for releasably holding a battery in electrical contact with the leads.

18 Claims, 5 Drawing Sheets

SEMICONDUCTOR WITH A BATTERY UNIT

BACKGROUND OF THE INVENTION

1. Field of Invention

This invention relates to a semiconductor with a battery unit and, in particular, to the structure of the battery unit. FIG. 1 is an elevational diagrammatic view of a prior art semiconductor device with a battery unit. The battery unit 60 consists of a battery 50 and two battery leads 51 and 52, each of which is jointed or connected at one end to one electrode of battery 50. The battery 50 and the battery leads 51 and 52 are molded in resin, thereby forming the battery unit 60. The battery unit 60 is mounted on the upper surface of the semiconductor device 55 molded in another mass of resin. The battery leads 51 and 52 extend to opposite ends of battery unit 60, and the battery leads 51 and 52 are soldered or welded to connection lead terminals 58 and 59 which are drawn from the semiconductor device within recesses 57 provided at both ends of semiconductor device 55. In addition, the junction within each recess 57 is covered with epoxy resin. This process is called potting and is not shown.

2. Prior Art A battery 50 cannot be replaced in the above prior art assembly because the battery is molded in resin. If the battery fails and must be replaced with a new one, the entire battery unit must be replaced. Thus this prior art system is inefficient. In addition, a power source shuts off when the battery unit is removed, thereby stopping the semiconductor device. Accordingly, a watch having this prior art system does not keep proper time, thereby causing problems, such as the loss of stored data. Further, it is difficult to align the battery unit with the semiconductor device. Therefore, another tool is required in order to correctly position the battery unit and the semiconductor device. Thus this prior art system is inefficient.

Furthermore, in the prior art, in order to protect the two junctions between the battery lead plates and the lead terminals from short-circuiting when the semiconductor device is handled with the bare hands, the junctions are covered with resin in the potting step. However, this step makes battery unit and semiconductor device replacement impossible and increases the number of steps for manufacturing such an assembly device.

SUMMARY OF THE INVENTION

One object of the present invention is to enable the battery to be replaced, without stopping the semiconductor device, by means of a battery unit in which the battery is removable. Therefore, a watch having a semiconductor device with a battery unit according to this invention will never fail to keep proper time and will not have to be reset after battery replacement.

Another object of this invention is to provide a semiconductor device which can be inexpensively manufactured by simplifying the step of positioning the battery unit and the semiconductor device and by eliminating the potting step.

The above and other objects are achieved, according to the present invention, by a semiconductor circuit assembly comprising: a semiconductor device including at least one semiconductor element, battery lead terminals connected to the element, and a molded resin body encapsulating the element and the lead terminals and having at least one main exterior surface; and a battery unit mounted on the exterior surface of the semiconductor device, the battery unit having battery leads connected to said lead terminals and a battery holder for releasably holding a battery in electrical contact with the leads.

An assembly according to this invention thus comprises three main components: a semiconductor device, batteries and a battery unit.

The semiconductor device is equipped with at least one semiconductor element and lead terminals to be connected to a power source. The semiconductor element and the lead terminals are potted together in resin.

The battery unit is equipped with battery leads and at least one battery holder for removably holding one or more batteries. Two or more battery holders are aligned in parallel electrically. The batteries may be inserted in the battery holder in respectively opposite directions.

The semiconductor device is composed of a body of resin that contains the semiconductor element and the lead frame and is formed to have a recess at each end. A lead terminal is joined to a battery lead of the battery within each recess. Then a cover block for positioning the battery unit is inserted in each recess. The battery unit is integrated with the cover block for positioning the battery unit, by means of resin molding.

BRIEF DESCRIPTION OF THE DRAWINGS

FIG. 1 is a side view of a prior art semiconductor device with a battery unit.

DESCRIPTION OF THE PREFERRED EMBODIMENTS

Figure 2:
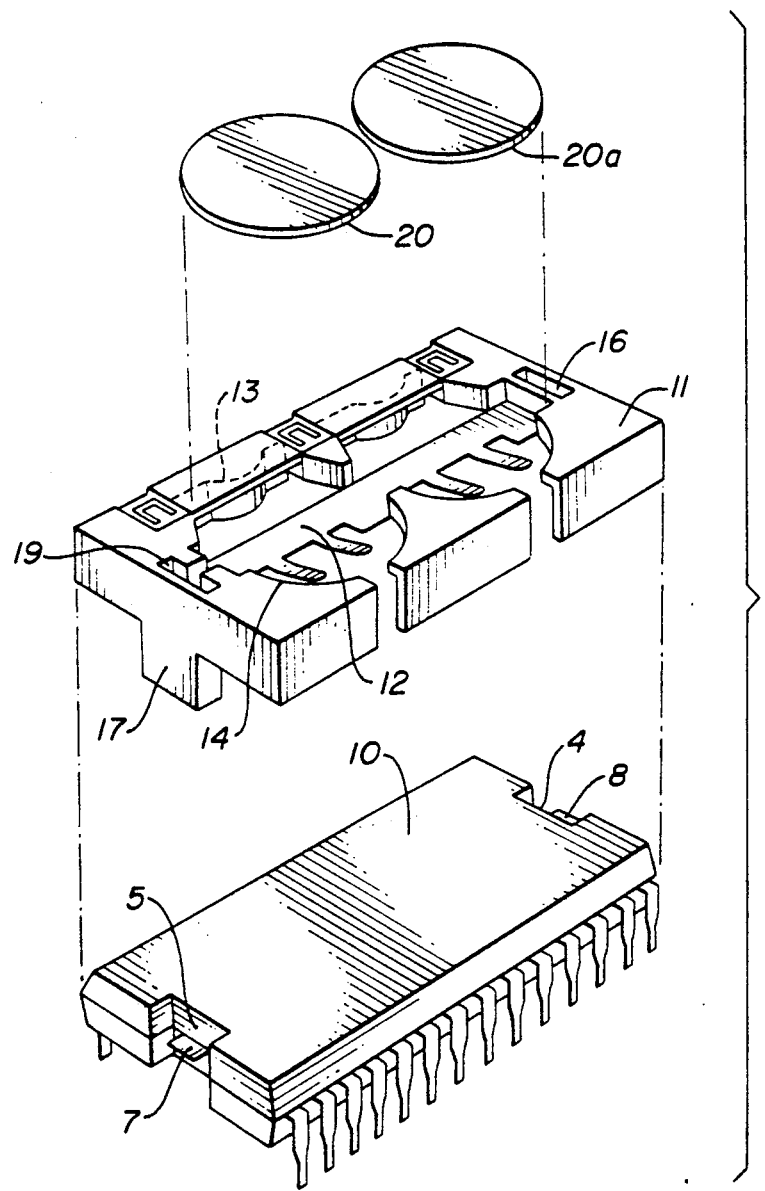
FIG. 2 is a perspective, exploded view of a semiconductor device with a battery unit according to one embodiment according to this invention.
Figure 3:
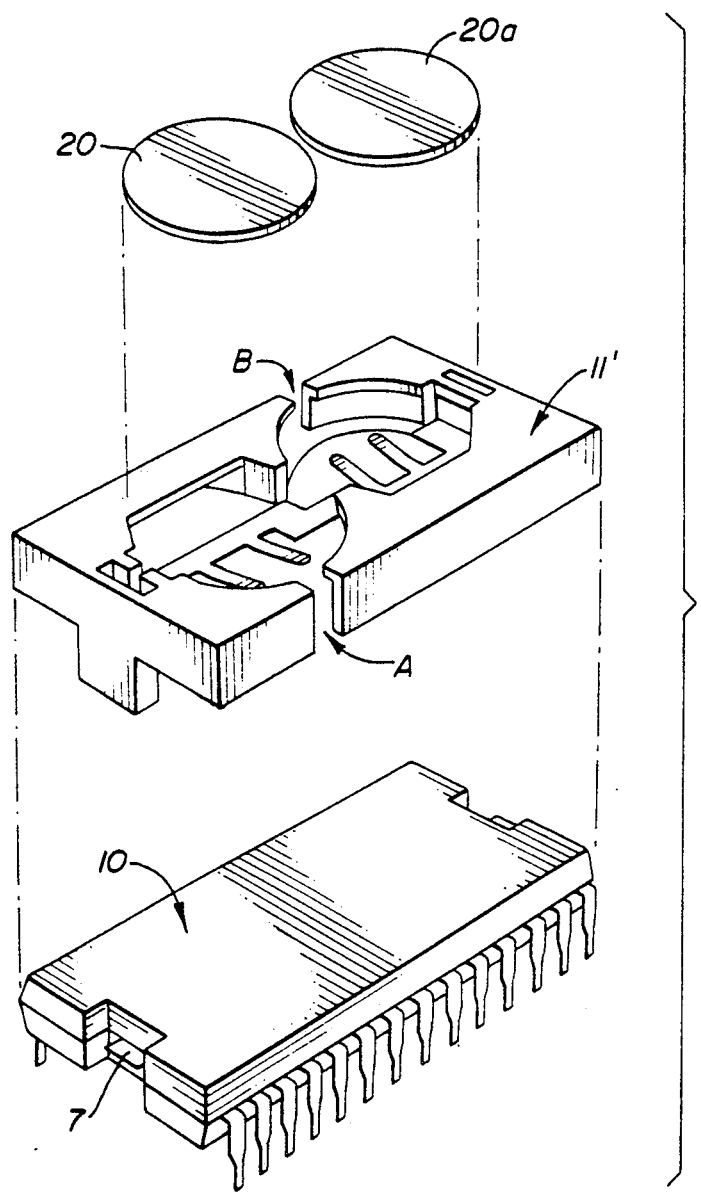
Figure 4:
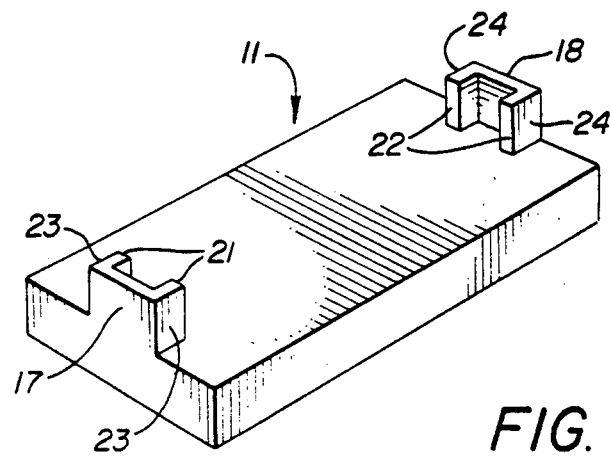

FIG. 2 is a perspective view of one embodiment of an assembly of a semiconductor device with a battery unit according to this invention. A semiconductor device 10 is composed of a molded resin block containing a semiconductor element laid on a die pad. The semiconductor element is coupled to a plurality of lead terminals, or connecting pins, by wire-bonding using Au fine wires, the connecting pins being connectable to a socket. In cut-out sections 4, 5 of semiconductor device 10, lead terminals 7 and 8, each of which is connected to a back-up power source (hereinafter referred to as connection lead terminals), are located. Terminals 7 and 8 are soldered or welded to battery leads 12 and 13, respectively, of battery unit 11. Battery unit 11 is mounted on the upper surface of the semiconductor device 10.

Battery unit 11 is equipped with at least one battery holder 14, in the illustrated embodiment two holders being provided. One battery lead 12 is laid on the lower surface of battery holders 14 and is connected to the bottom (negative electrode in this embodiment) of the battery 20. The other battery lead 13 is laid on a side of battery holders 14 and is connected to the other electrode (positive in this embodiment) of battery 20. In addition, the two battery holders 14 are aligned in parallel with one another and the battery leads 12, 13 are connected to respective connection lead terminals 7, 8.

Figure 6:
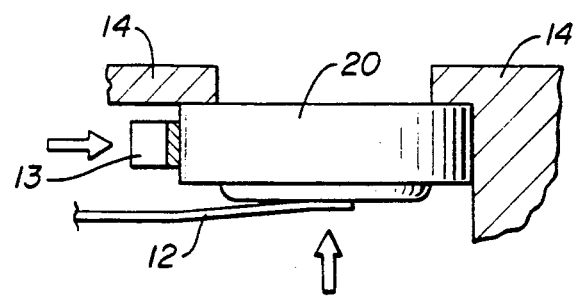
FIG. 6 is a sectional view of a part of a battery holder according to the invention.

Insertion and retention of battery 20 or 20a in battery unit 11 will be described with reference to FIG. 6. Each battery holder 14 is formed to have a ledge which surrounds a battery compartment. Battery 20 is inserted from the right by inserting the leading, or left-hand, edge of battery 20 beneath the ledge formed on battery holder 14. Battery 20 is then pressed against contact points of lead 13 until the trailing edge of battery 20 moves past an associated portion of the battery compartment ledge. Battery 20 is then pushed down, against the spring force of lead 12, until it clears the ledge. Battery 20 will then slide to the right, beneath the ledge, under the action of the spring force produced by lead 13.

To remove battery 20, it need only be slid to the left by a manual force until the right-hand side of battery 20 clears the associated ledge portion, at which time battery 20 will be forced upwardly by lead 12.

Thus, when inserted in a battery compartment, leads 12 and 13 press against the battery with spring forces which assure a secure connection. According to the invention, two batteries 20, 20a are put in the battery holders 14 in parallel. If the two batteries are removed one by one (not both at once) and replaced with new ones in order, the semiconductor device 10 will not be stopped during replacement of the batteries.

Figure 3:
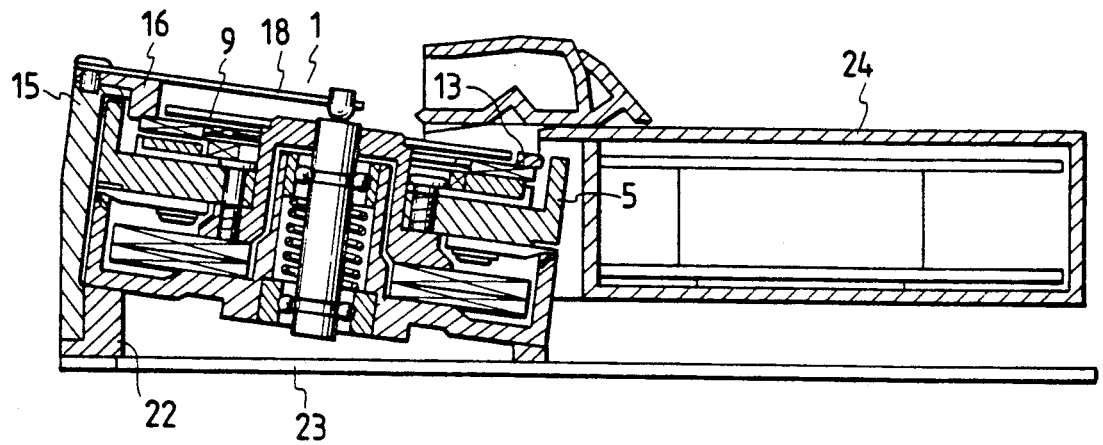
FIG. 3 is a view similar to that of FIG. 2 of another embodiment according to the invention.
Figure 7:
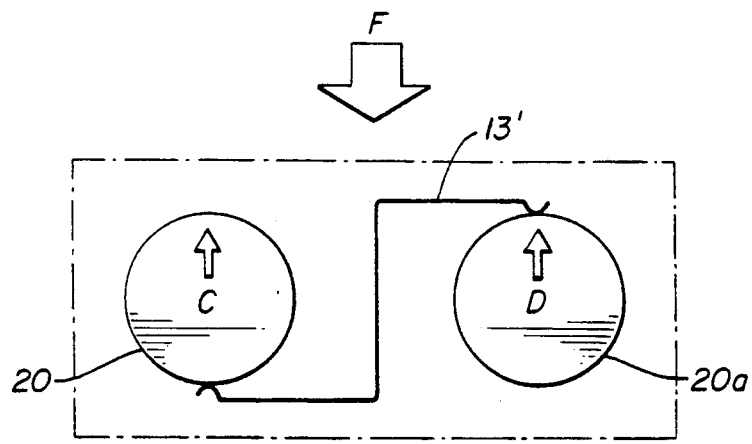
FIG. 7 is a diagrammatic view according to the invention, illustrating the movement of batteries if a shock is imparted to a semiconductor device with the battery unit according to this invention.
Figure 8:
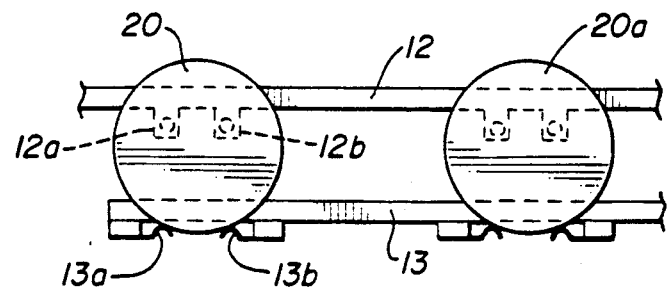
FIG. 8 is a pictorial view showing the shape of battery leads of a semiconductor with the battery unit according to this invention.

As shown in FIG. 3, modified battery unit 11' is constructed so that each battery 20, 20a is inserted in a respectively opposite direction. For example, battery 20 is inserted in direction A and battery 20a is inserted in direction B. As shown in the plan view of FIG. 7, battery lead 13' is given nearly an S-shape. If a shock F is given to this battery unit, battery 20 is moved in direction C and its contact with lead 13' may be broken, while battery 20 is moved in direction D and is thus pressed against lead 13'. Therefore, both batteries are not disconnected at once from battery lead 13', thereby maintaining a supply of operating power to the semiconductor device (not shown). Furthermore, as shown in FIG. 8, there can be a plurality of points of contact between battery leads 12, 13 and batteries 20, 20a. In this embodiment, there are two points of contact, i.e. 12a, 12b, and 13a, 13b for each battery. If battery leads 12, 13 are connected to battery 20a at points like 12a, 12b, 13a, 13b, the reliability of connection will be improved.

Figure 4:
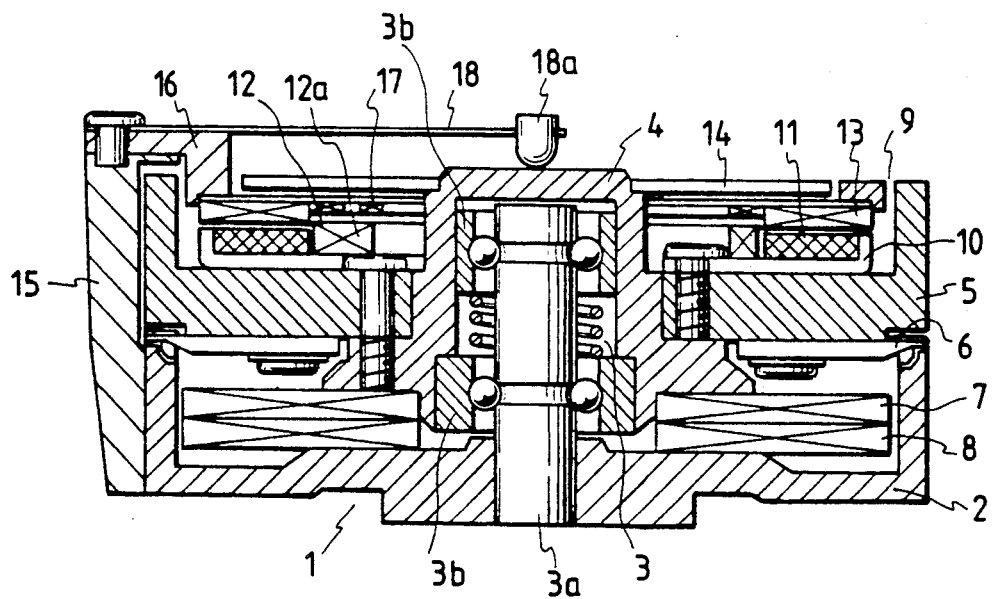
FIG. 4 is a perspective view of the underside of a battery unit of an assembly according to this invention.

In a semiconductor device with a battery unit according to this invention, a method for combining the battery unit with a semiconductor device will be described with reference to FIGS. 2, 4 and 5. FIG. 4 is a perspective view of the underside of the battery unit 11. Semiconductor device 10 has recesses 4, 5 at its two ends, and connection lead terminals 7, 8 to be connected to the battery 20 for back-up power supply for semiconductor 10 extend into recesses 4 and 5. The battery unit 11 is mounted on the upper surface of semiconductor device 10. Battery leads 12 and 13 (negative electrode and positive electrode, respectively) are jointed or connected to each electrode of battery 20 and/or battery 20a. Battery leads 12 and 13 are extended and bent so as to pass through respective holes 16 and 19 of battery unit 11, and are then soldered to the connection lead terminals 7, 8 of semiconductor device 10.

Cover blocks 17 and 18 for positioning battery unit 11 are formed at both ends of the battery unit 11 so that they correspond to the plane dimension of recesses 4, 5 at both ends of semiconductor device 10. Here, the cover blocks 17, 18 for positioning battery unit 11 are integrated with the battery unit 11. By inserting the cover blocks 17, 18 into the recesses 5, 4 of semiconductor device 10, semiconductor device 10 and the battery unit 11 can be positioned relative to one another parallel to the plane along which they are in contact. With respect to the longitudinal direction between blocks 17 and 18, semiconductor device 10 and battery unit 11 can be positioned by inside planes 21 and 22. With respect to the width direction, semiconductor device 10 and battery unit 11 can be positioned by the outside planes 23, 24. Desirably, cover blocks 17 and 18 are integral with battery unit 11. If it is difficult to integrate the cover blocks with the battery units, they may be formed separately. For example, the cover blocks may be fixed to battery unit 11 by screws or adhesive materials. In this case, the cover blocks perform the same function as described above.

Further, cover blocks 17, 18 are formed in a U-shape and positioned face to face with each other. When the joint region between the connection lead terminals 7, 8 of the semiconductor element 10 and battery leads 12, 13 of battery unit 11 is handled with the bare hands, the terminals and leads are protected against contact.

Figure 5A:
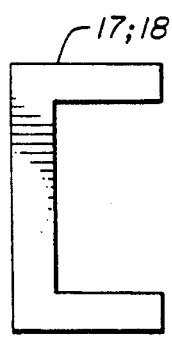
FIGS. 5 (a), (b) and (c) are detail views of various configurations of a part of a battery unit according to this invention.
Figure 5B:
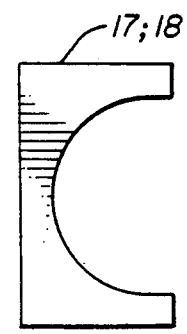
Figure 5C:
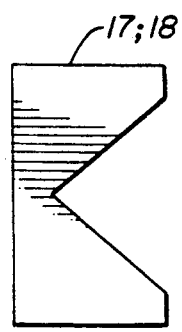

Regarding the internal shape of cover blocks 17 18, this invention is not limited to the U-shaped cover blocks shown in FIGS. 4 and 5a. As illustrated in FIGS. 5b and 5c for example, blocks with an interior surface in the form of a semi-circle or triangle can be employed if only such shaped cover-blocks have a space necessary for a junction and can cover the end of the connection lead terminals. Furthermore, the outer lead shape of a semiconductor device is not illustrated and not limited to any particular shape. The effects of this invention are not different from that of another type of outer lead shape of a semiconductor device.

Furthermore, if the battery unit is equipped with other elements, such as capacitors or quartz oscillators as well as a battery, the effects of this invention are not different.

A semiconductor device according to this invention provides the following benefits.

Since a plurality battery holders are aligned in parallel electrically and batteries can be detached from the battery holder, batteries can be detached one by one without shutting off the power source of a semiconductor. Since the semiconductor device does not stop, a timepiece with this semiconductor device never fails to keep proper time or loses stored memory.

In addition, the insertion directions of batteries are changed according to each battery holder, thereby preventing a plurality of batteries from losing contact all at once if a shock moves batteries into the direction that the batteries are removed. Thus the semiconductor according to this invention is improved in reliability.

Furthermore, a battery unit and a semiconductor device can be easily positioned in the plane direction, without any further positioning tools, by providing the cover units with the battery units. Furthermore, short-circuiting can be prevented when the elements are handled with the bare hands This application relates to subject matter disclosed in Japanese Application Numbers 217067/89 and 217068/89 filed on Aug. 23, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor circuit assembly comprising:
   a semiconductor device including at least one semiconductor element, battery lead terminals which are connected to said element, and a molded resin body which encapsulates said element and said lead terminals and having at least one main exterior surface; and
   a battery unit which is mounted on said main exterior surface of said molded resin body, said battery unit having battery leads connected to said lead terminals and a battery holder for releasably holding a battery in electrical contact with said leads,
   wherein said battery unit has an exterior surface which faces away from said semiconductor device when said battery unit is mounted on said main exterior surface of said molded resin body, said battery holder is open at said exterior surface of said battery unit, and said battery leads are positioned relative to said holder for permitting removal of a battery from said holder while said battery unit is mounted on said main exterior surface of said molded resin body.

2. An assembly as defined in claim 1 wherein there is a plurality of battery holders in said battery unit, each said holder being structured for holding a respective one of a plurality of batteries so that the batteries are in electrical parallel connection.

3. An assembly as defined in claim 2 wherein said battery holders and said leads are constructed such that each holder has a battery insertion direction which is different from that of at least one other holder.

4. An assembly as defined in claim 1 wherein each said lead has a plurality of battery contact points for one battery.

5. An assembly as defined in claim 1 wherein each said battery lead extends between said main exterior surface of said molded resin body and said battery unit.

6. An assembly as defined in claim 1 wherein said battery leads are constructed to press against a battery held in said battery holder with a spring force and said battery holder includes a battery retaining part for mechanically retaining a battery in said battery holder.

7. An assembly as defined in claim 1 wherein said battery lead terminals protrude from said molded resin body and are bonded to said battery leads, and said battery unit rests against said main exterior surface of said resin body.

8. An assembly as defined in claim 1 wherein said battery unit and said semiconductor device comprise positioning means for establishing a defined position between said battery unit and said semiconductor device.

9. An assembly as defined in claim 2 further comprising two batteries each held in a respective battery holder.

10. An assembly as defined in claim 1 further comprising a battery held in said battery holder.

11. A semiconductor circuit assembly comprising:
    a semiconductor device including at least one semiconductor element, two battery lead terminals which are connected to said element, and a molded resin body which encapsulates said element and said lead terminals, said body having two opposed ends, with each end being provided with a recess and each lead terminal projecting into a respective recess;
    a battery unit having two battery leads each connected to a respective lead terminal and a battery holder for releasably holding a battery in electrical contact with said leads for supplying power to said semiconductor element; and
    two positioning members which are connected to said battery unit and which are each seated in a respective recess of said molded resin body for holding said battery unit in a defined position relative to said molded resin body.
    wherein said battery unit has an exterior surface which faces away from said semiconductor device when said battery unit is being held in said defined position relative to said molded resin body, said battery holder is open at said exterior surface of said battery unit, and said battery leads are positioned relative to said holder for permitting removal of a battery from said holder while said battery unit is being held in said defined position relative to said molded resin body.

12. An assembly as defined in claim 11 wherein said battery unit further includes a second molded resin body and said positioning members are integral parts of said second molded resin body.

13. An assembly as defined in claim 12 wherein said first-recited molded resin body has a main exterior surface on which said battery unit is mounted, each said recess has three surfaces which extend transversely to said main exterior surface, and each positioning member has three surfaces which engage said three surfaces of a respective recess to locate said battery unit in the defined position relative to said first-recited molded resin body.

14. An assembly as defined in claim 13 wherein each said positioning member surrounds a respective battery lead terminal in the region of connection to its associated batter lead.

15. An assembly as defined in claim 12 wherein each said positioning member surrounds a respective battery lead terminal in the region of connection to its associated battery lead.

16. An assembly as defined in claim 11 wherein said semiconductor device further comprises a plurality of connecting pins connected in circuit with said semiconductor element and connectable to a socket.

17. An assembly as defined in claim 2 wherein each of said battery leads is constructed to be electrically connected to each of the batteries.

18. An assembly as defined in claim 10 wherein said battery has the form of a thin disk with a peripheral edge and one of said battery leads is constructed to electrically contact the peripheral edge of said battery.

* * * * *